(12) United States Patent
Pfeiffer et al.

(10) Patent No.: US 6,574,647 B1
(45) Date of Patent: Jun. 3, 2003

(54) FILTER ARRANGEMENT

(75) Inventors: Johann Pfeiffer, Vienna (AT); Manfred Listopad, Vienna (AT)

(73) Assignee: Ericsson Austria AG, Vienna (AT)

( * ) Notice: Subject to any disclaimer, the term of this patent is extended or adjusted under 35 U.S.C. 154(b) by 0 days.

(21) Appl. No.: 09/582,163

(22) PCT Filed: Dec. 16, 1998

(86) PCT No.: PCT/AT98/00307

§ 371 (c)(1),
(2), (4) Date: Sep. 18, 2000

(87) PCT Pub. No.: WO99/34507

PCT Pub. Date: Jul. 8, 1999

(51) Int. Cl.⁷ .............................................. G06F 17/10
(52) U.S. Cl. ..................................................... 708/300
(58) Field of Search ........................................ 708/300

(56) References Cited

U.S. PATENT DOCUMENTS 3,928,755 A * 12/1975 Bellanger et al. ........... 708/313
4,630,099 A * 12/1986 Rzeszewski ............. 348/389.1
5,255,267 A * 10/1993 Hansen et al. ............... 370/401
2002/0151289 A1 * 10/2002 Rahman et al. .......... 455/232.1

FOREIGN PATENT DOCUMENTS

| EP | 0 677 938 A1 | 10/1995 |
| WO | 97/11534 | 3/1997 |
| WO | 97/48206 | 12/1997 |

* cited by examiner

Primary Examiner—David H. Malzahn

(57) ABSTRACT

The invention relates to a filter arrangement for separating analog or digital baseband signals, for example, POTS or ISDN signals and digital wideband signals, which are simultaneously transmitted on a two-wire line of a message transmission system. In accordance with an exemplary embodiment of the invention, the filter arrangement has a bi-directional low-pass filter (4) and a bi-directional high-pass filter (3). The low-pass filter (4) includes a first filter (6) with a first passband. The first filter (6) permits flow-through of direct current. A second filter (7) with a second passband is preferably arranged assembled by connecting the inputs and outputs of the first and second filters (6, 7) in parallel.

10 Claims, 3 Drawing Sheets

FILTER ARRANGEMENT

This application is a National Stage Application of PCT International Application No. PCT/AT98/00307, filed Dec. 16, 1998, which claims priority from Austrian Patent Application No. A 2182/97, filed Dec. 23, 1997.

BACKGROUND OF THE INVENTION

1. Field of the Invention

The invention relates to a filter arrangement for separating analog or digital baseband signals, for example POTS or ISDN signals, which are transmitted simultaneously on a two-wire line of a telecommunications system, and digital broadband signals.

2. Description of Related Art

Broadband methods such as ADSL, VDSL and xDSL or the like use the frequency band above the baseband which is occupied, for example, by POTS (Plain Old Telephone) or ISDN signals. In a telephone system, these different transmission services use the same subscriber line as transmission medium.

The broadband transmission method ADSL (Asymmetric Digital Subscriber Line), which is becoming increasingly important, thus permits large amounts of digital information to be transmitted over a two-wire subscriber line in one direction from a central office, for example a central switching office, to the subscriber, and permits control functions to be transmitted in both directions. At present, QAM methods, for example DMT (Discrete Multi-tone Modulation) or CAP (Carrierless Phase modulation), are often applied in ADSL telecommunications systems, the signals which are formed being superimposed on the analog or digital telephone signals, for example POTS or ISDN, in terms of frequency. Both at the office end and at the subscriber end, the signal which is to be transmitted or is transmitted on the subscriber line is separated by means of separate filter arrangements (ADSL Splitter Filter) into the two components baseband signals and broadband signals, for reception, and is superimposed for transmission.

For this purpose, for example, ADSL filters are composed of a bidirectional low pass and a bidirectional high pass filter, the POTS and/or the ISDN signal being separated out of the line signal by means of the low pass filter, and the ADSL or DMT signal being separated out of the line signal by means of the high pass filter.

A filter arrangement of this type is used in WO-A1-97/11534 for simultaneously transmitting broadband signals and digital ISDN baseband signals or analog signals over a two-wire line. A bidirectional broadband transmission device and an ISDN switching unit of a central office are connected here by means of an ADSL filter arrangement to one end of the two-wire line over which data can be transmitted and received. The other end of the two-wire line is connected via a further ADSL filter arrangement to a subscriber-end bidirectional broadband transmission device and an ISDN network connection. The transmission limit of the low pass filter of the ADSL filter arrangement is selected in each case in such a way that its bandwidth is sufficient for the transmission of baseband signals.

Depending on the different national input impedances, the low pass filter is provided as a passive or an analog active filter for each respective subscriber.

In addition, EP-A1-677-938 discloses a filter arrangement which is composed of a low pass filter and a high pass filter and via which baseband POTS and broadband ADSL signals can be coupled to a common two-wire line. One portion of the ADSL signal can be lost here through the POTS low pass filter if the POTS signal is not sufficiently damped by the two-wire line. This occurs, for example, if the two-wire line is too short. The reason for this loss of the ADSL signal is that the filter properties of the low pass filter can change as a result of an excessively high POTS signal, because, for example, filter inductors become magnetically saturated. The low pass filter itself has series inductors which transmit d.c. current. An excessively high d.c. signal causes these inductors to become saturated and thus reduces their inductivity, as a result of which part of the ADSL signal is directed via the low pass filter and is lost. In order to avoid the low pass inductors becoming saturated, a variable resistor is connected between the POTS unit and the low pass filter, which resistor is controlled by a control signal which sets the impedance value of the variable resistor as a function of the damping on the two-wire line in such a way that an excessively high POTS received signal is damped, while POTS signals with a normal level are passed on without damping.

One disadvantage of the known broadband filter arrangements is the very large amount of space required to form an analog filter. In addition, the national telephone input impedances must always be taken into account, resulting in different designs of the filter arrangements for each country.

SUMMARY OF THE INVENTION

An object of the invention is therefore to specify a filter arrangement of the type mentioned at the beginning which requires only a small amount of space and which can easily be adapted, at low cost, to the respective requirements in terms of subscriber-specific terminating unit impedances.

In accordance with exemplary embodiments of the invention, this is achieved in that the low pass filter is composed of at least one first, d.c.-transmissive filter with a first passband and at least one second filter with a second passband, so that the first and second passbands together essentially form the passband of the low pass filter, and in that the inputs of the first and second filters are connected in parallel.

The basic idea of the invention consists in dividing the low pass filtering of the baseband signals into at least two filter bands in order thus to permit better adaptation of the filtering to the present requirements, enabling a particularly favorable filtering option to be provided for each filter band. The two filter bands can be selected here in such a way that existing frequency gaps in the transmission signals come to be located between said bands, and an overlapping region of the filter bands is thus not necessary. The first, d.c.-transmissive low pass filter can be of relatively simple, discrete design, but this eliminates the d.c.-transmissivity for the second filter, which therefore has to be capable of being dimensioned specifically for relatively high frequency bands.

According to one further embodiment of the invention, the outputs of the first and of the second filter can be connected in parallel.

In a further embodiment of the invention it is possible to provide for the first filter to be formed from a low-band low pass filter and for the second filter to be formed from a high band bandpass filter, the passband of the low-band low pass filter extending from d.c.-transmissivity of 0 Hz to a first upper limiting frequency, and the passband of the high-band bandpass filter extending from a second lower limiting frequency to a second upper limiting frequency, the first upper limiting frequency preferably being lower than the second lower limiting frequency.

The baseband frequency band of two filters is therefore divided into a lower band and an upper band, the lower band being transmissive to d.c. current, which is a precondition for maintaining the feeding of the individual subscribers. Furthermore, the lower frequency band also covers low-frequency alternating voltages, for example the call voltage. Between the first upper and the second lower limiting frequency it is also possible to form a frequency gap which has no further disruptive effect because in conventional telephone networks there are no signal frequencies to be transmitted between the frequency bands for signaling or feeding and the lower voice frequencies.

The low-band low pass filter can easily be embodied as a passive low pass filter which contains, for example, inductors and capacitors. The requirements for the lower frequency band, which contains d.c. current and low frequencies, are, however, correspondingly small in comparison with the upper frequency band of the low pass filter operation, with the result that it is virtually impossible to achieve further simplification or savings in terms of space.

However, a significant reduction of the dimensions of the filter provided for the upper frequency band of the low pass filtering operation is achieved in that, according to one variant of the invention, the high-band bandpass filter is formed from at least one circuit arrangement comprising a digital signal processor. In a further embodiment of the invention, it is, however, also possible to form the high-band bandpass filter from at least one circuit arrangement comprising a digital filter.

The digital filtering which is made possible by this eliminates the relatively bulky iron cores of the conventional low pass filters, with the result that the space which would be necessary for them can be reduced considerably. A further advantage is the high adaptability of the DSP filter according to the invention. The telephone network operators often specify different real or complex line impedances for their POTS subscribers, complex impedances requiring active broadband filtering. If the POTS configuration is, on the other hand, defined for a purely real impedance, a passive broadband filtering arrangement is sufficient. Because the filter characteristic can be adjusted by means of suitable programming of the digital signal processor, it is however, possible to adapt both a real (600 ohm) and complex input impedance (for example $Z_n$).

It is particularly preferable here to select limiting frequencies which, according to one exemplary embodiment of the invention, can be determined by virtue of the fact that the first upper limiting frequency lies in the range between 25 Hz and 70 Hz, and is preferably 50 Hz, and the second lower limiting frequency lies in the range between 250 Hz and 350 Hz, and is preferably 300 Hz.

The transmissivity of the low pass filter is thus made possible both for signaling and feeding and for the lowest voice signal frequencies.

In this context there may be provision, according to a further exemplary embodiment of the invention, for the second upper limiting frequency to lie in the range between 3300 Hz and 3500 Hz, and to be preferably 3400 Hz.

As a result, the filter arrangement according to the invention in the POTS channel is transmissive even for the highest defined voice signal frequencies.

If the transmission of toll pulses is also to be made possible through the high-band bandpass filter, it is possible to provide, in a further embodiment of the invention, that the second upper limit frequency lies in the range between 11 kHz and 13 kHz, and is preferably 12 kHz, or lies in the range between 15 kHz and 17 kHz, and is preferably 16 kHz.

According to another variant of the invention, the simultaneous transmission of digital ISDN signals and digital broadband signals may be advantageously brought about be virtue of the fact that the second upper limiting frequency lies in the range above 70 kHz, and is preferably 80 kHz.

As a result, the ISDN signals are also transmitted by the high-band bandpass filter and can thus be passed to the subscriber terminal provided for them, and/or to the appropriate ISDN unit. Thus, in additional to a transmission of ADSL and POTS signals, it is also possible to transmit ISDN signals or signals related to them, for example PCM-2, PCM-4 or the like.

Furthermore, the invention relates to a system for simultaneously transmitting analog or digital baseband signals, for example POTS or ISDN signals, and digital broadband signals for a plurality of subscribers, each having a filter arrangement according to the invention for each subscriber line, said filter arrangements being arranged in a central office of a telecommunications system, for example in a switching office.

Until now, all baseband signals have had to be routed via separate broadband filter arrangements in switching offices in order to separate the broadband signals, in which case a discrete high pass filter and low pass filter was respectively provided for each subscriber line. These filters can be of either passive or active design depending on the respective national and regional regulations. The space required owing to the iron cores necessary to construct the filters is relatively large, and is of the order of magnitude of approximately 90 $cm^2$ for each filter, so that when there are a plurality of subscribers an upper limit is quickly reached in many existing switching offices, which cannot be exceeded owing to lack of space. Furthermore, the additional provision of a broadband filtering arrangement for each subscriber connection entails basic expenditure in terms of maintenance and down times.

An object of the invention is therefore to specify a system with which the space required for a broadband transmission can be reduced in comparison with known systems.

A further object of the invention is to provide a system with a low maintenance requirement.

This is achieved according to the invention in that the high-band bandpass filters which are associated with the subscribers can each be embodied as circuit arrangements comprising at least one digital signal processor, and in that the digital signal processors of these circuit arrangements are combined in a single digital signal processor unit.

By using an appropriately powerful signal processor, it is thus possible to perform parallel processing of a plurality of baseband channels, for example POTS and/or ISDN channels. The filter characteristic can be appropriately adapted for each channel. The combination of a plurality of high-band bandpass filters in one DSP unit permits not only a saving in terms of space but generally a lower level of expenditure on maintenance and on equipment.

BRIEF DESCRIPTION OF THE DRAWINGS

The invention is explained in more detail below with reference to the exemplary embodiments illustrated in the accompanying drawings. Like elements in the drawings have been designated by like reference numerals.

DETAILED DESCRIPTION OF THE INVENTION

Figure 1:
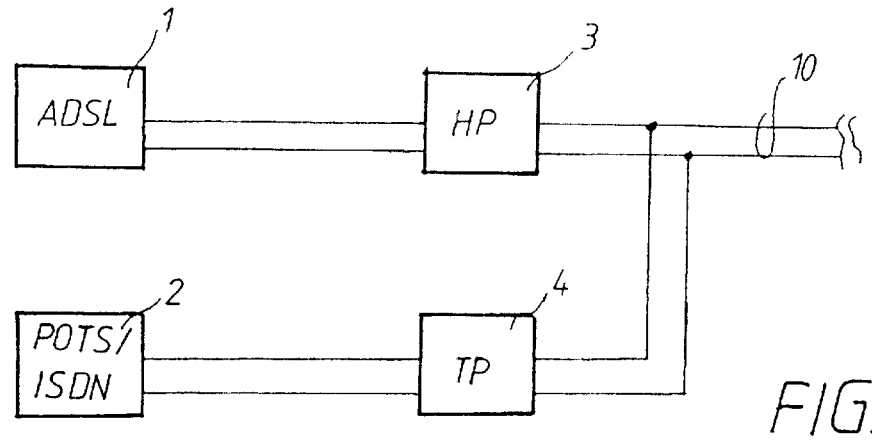
FIG. 1 shows a block circuit diagram of a filter arrangement according to the prior art.

FIG. 1 illustrates a filter arrangement for separating, according to the prior art, analog or digital baseband signals which are transmitted simultaneously on a two-wire line 10 of a telecommunications system.

Here, analog or digital baseband signals, for example POTS or ISDN signals and digital broadband signals, for example ADSL signals, which are superimposed on the latter in terms of frequency, can be transmitted and received on the two-wire subscriber line 10, which leads, for example, from a switching office to a subscriber. The type baseband and broadband signals described here by way of example does not constitute a restriction on the invention.

In order to separate the broadband and baseband signals superimposed on the subscriber line 10, a bidirectional low pass filter 4 and a bidirectional high pass filter 3 are provided, which filters 3 and 4 pass on the baseband signals, for example, to a POTS or ISDN unit 2, and pass on the broadband signals, for example ADSL signals, to a broadband unit 1, and/or combine these signals in the other direction on the subscriber line 10 over which they are transmitted to a subscriber.

The disadvantage of existing filter arrangements of this type consists in the fact that the low pass filter 4 requires a relatively large amount of space because relatively large-volume iron cores are required to implement it.

Figure 2:
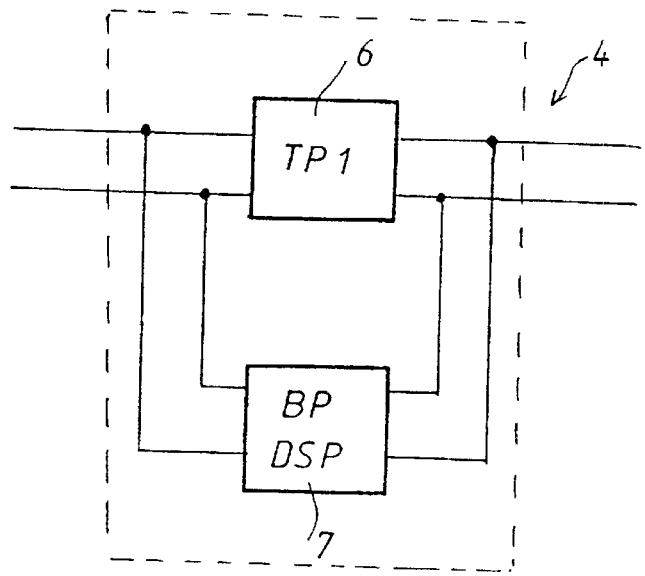
FIG. 2 shows a block circuit diagram of an embodiment of the filter arrangement according to the invention.
Figure 3:
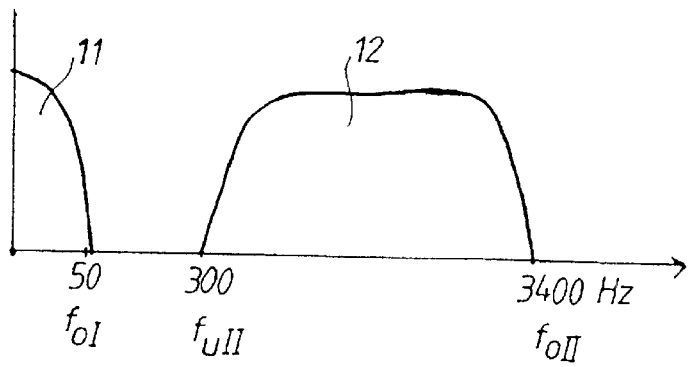
FIG. 3 shows a graph of the filter characteristic of an embodiment of the filter arrangement according to the invention.
Figure 4:
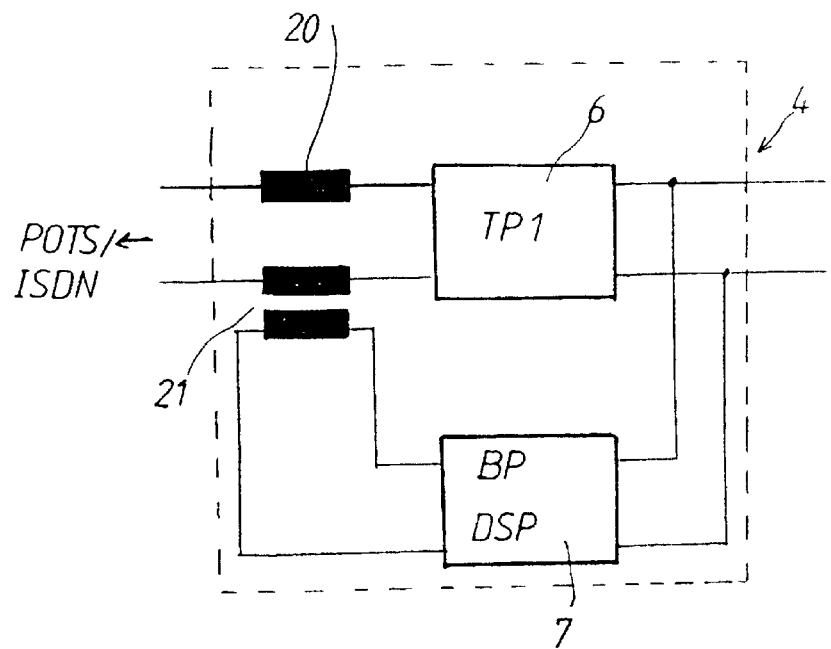
FIGS. 4, 5, 6 and 7 each show a block circuit diagram of a further embodiment of the filter arrangement according to the invention.
Figure 5:
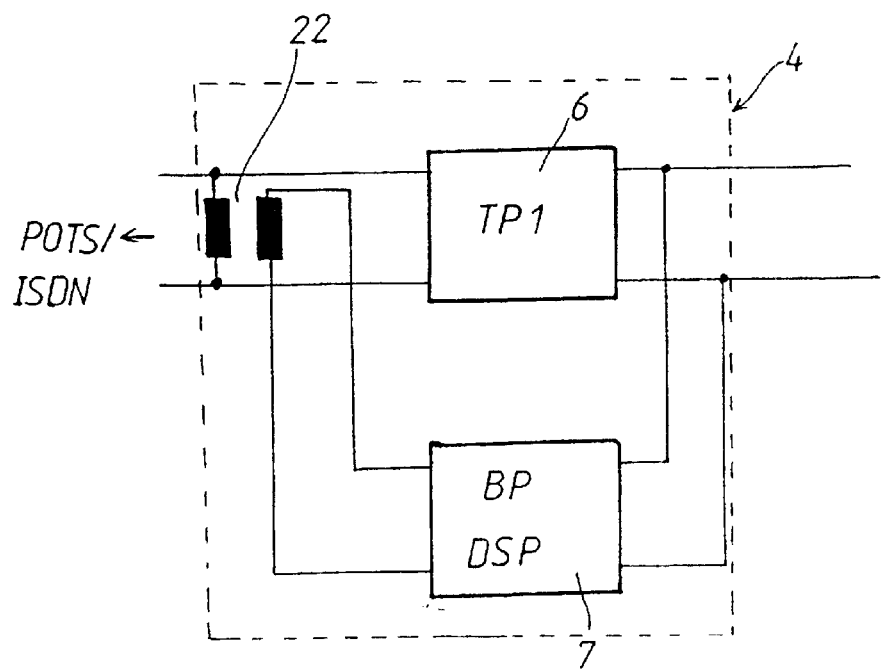
Figure 6:
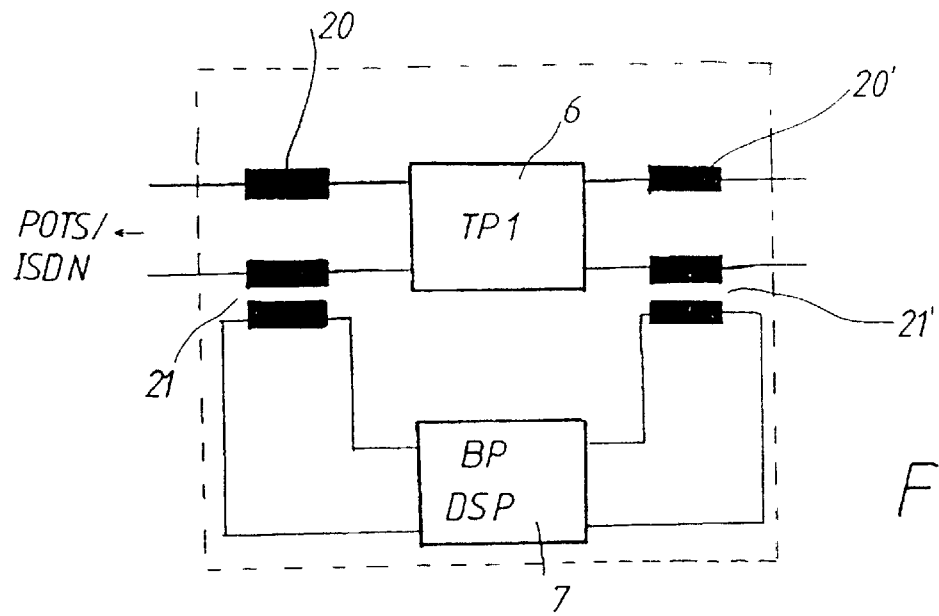
Figure 7:
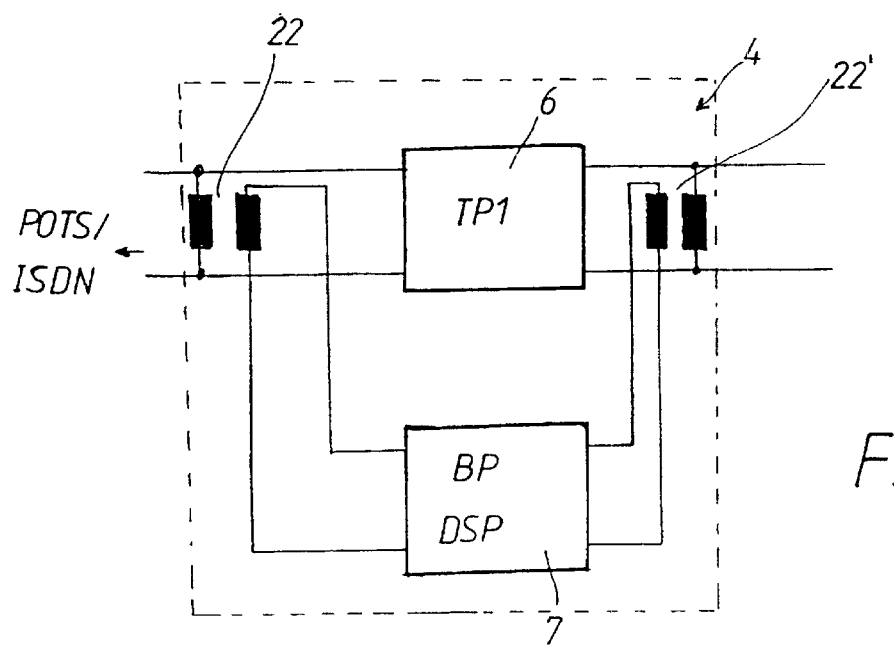

In the exemplary embodiment according to FIG. 2, this is remedied according to the invention in that the low pass filter 4 is composed of at least one first, d.c.-transmissive filter 6 with a first passband 11, and at least one second filter 7 with a second passband 12 by means of parallel connection of the inputs and outputs of the two filters 6, 7, which passbands are illustrated by way of example in FIG. 3.

The first filter is formed, according to FIG. 2, from a low-band low pass filter 6, and the second filter is formed from a high-band bandpass filter 7, the passband of the low band low pass filter 6 extending from d.c.-transmissivity or 0 Hz to a first upper limiting frequency $f_{oI}$.

All the signaling and feed voltages can be transmitted in this frequency band, the transmissivity for d.c.current at 0 Hz being central to the function because otherwise the subscriber cannot be fed.

The first upper limiting frequency $f_{oI}$ can be selected in the range between 25 Hz and 70 Hz, but it is preferably 50 Hz, because this constitutes the upper limit for the customary call alternating voltages.

The passband of the high-band bandpass filter 7 extends from a second lower limiting frequency $f_{uII}$ to a second upper limiting frequency $f_{oII}$.

The first upper limiting frequency $f_{oI}$ of the low band filter 6 is selected in the example according to FIG. 3 to be lower than the second lower limiting frequency $f_{uII}$, because neither baseband frequencies nor frequencies which are used to maintain operation occur in the intermediate band.

The high-band bandpass filter 7 is formed from a circuit arrangement comprising at least one digital signal processor (DSP) with which a filter characteristic, such as corresponds to the band 12 in FIG. 3, can be generated by appropriate programming. These circuit arrangements contain not only the signal processors but also other units, for example analog/digital converters, which are indispensable for simulating a filter. However, instead of the DSP, digital filters may also be used. These can be implemented cost-effectively, in comparison with DSP, as ASIC circuits as soon as an appropriate production volume is exceeded.

The iron cores, which require a large amount of space, from the conventional low pass filters can thus be replaced with entirely equivalent elements, resulting in a considerable reduction in the space required.

The second lower limiting frequency $f_{uII}$ of the DSP 7 lies preferably in the range between 250 Hz and 350 Hz, and is preferably 300 Hz, and the second upper limiting frequency $f_{oII}$ lies in the range between 3300 Hz and 3500 Hz, and is preferably 3400 Hz, so that the customary voice signal range thus comes to be located within the passband.

If, in addition, toll pulses are also to be allowed to pass through the high-band bandpass filter, the second upper limiting frequency $f_{oII}$ can be selected to lie in the range between 11 kHz and 13 kHz, being preferably 12 kHz, or to lie in the range between 15 kHz and 17 kHz, being preferably 16 kHz.

For ISDN applications, the second upper limiting frequency is accordingly selected to lie in the range above 70 kHz, being preferably 80 kHz, so that the ISDN signals can also be passed to the appropriate ISDN unit, or be transmitted by them.

FIG. 2 shows a parallel connection of the respective inputs and outputs of the low-band low pass filter 6 and of the high-band bandpass filter 7.

However, in order to fulfil all the requirements for correct adaptation to the respective telephone system, an important measure is to adapt the filter arrangement to the input impedance of the subscriber or of the respective POTS or ISDN unit 2. For this purpose, appropriate circuit variants with which the correct adaption can be performed by appropriately dimensioning the inductor 20, 20' and converters or signal transformers 21, 21' and 22, 22' which are connected upstream of the inputs and outputs are shown in the exemplary embodiments according to FIGS. 4, 5, 6 and 7. Mixed forms of these variants are also possible.

In switching offices or other central offices of a telecommunications system, one filter arrangement is required for each subscriber or each subscriber line. In order to reduce the expenditure on individual separate units, according to the invention it is possible to provide for the high-band bandpass filters which are associated with the subscribers to be embodied as circuit arrangements comprising at least one digital signal processor, and for the signal processors to be combined in a single digital signal processor unit. If the signal processor is given appropriately powerful dimensioning, parallel processing of a plurality of POTS or ISDN channels can be carried out and the filter characteristic can be adapted to the respective requirements, in particular to the input impedances.

It will be appreciated by those skilled in the art that the present invention can be embodied in other specific forms without departing from the spirit or essential characteristics thereof, and that the invention is not limited to the specific exemplary embodiments described herein. The presently disclosed exemplary embodiments are therefore considered in all respects to be illustrative and not restrictive. The scope of the invention is indicated by the appended claims rather than the foregoing description, and all changes that come within the meaning and range and equivalents thereof are intended to be embraced therein.

What is claimed is:

1. A filter arrangement for separating analog or digital baseband signals, for example POTS or ISDN signals, which are transmitted simultaneously on a two-wire line of a telecommunications system, and digital broadband signals, comprising:

a bidirectional low pass filter which transmits the baseband signals in its passband; and a bidirectional high pass filter which transmits the broadband signals in its passband, wherein the low pass filter comprises:

at least one first, d.c.-transmissive filter with a first passband and at least one second filter with a second passband, so that the first and second passbands together essentially form the passband of the low pass filter, and wherein the inputs of the first and second filters are connected in parallel.

2. The filter arrangement as claimed in claim 1, wherein the outputs of the first and second filters are connected in parallel.

3. The filter arrangement as claimed in claim 1, wherein the first filter is formed from a low-band low pass filter and the second filter is formed from a high-band bandpass filter, the passband of the low-band low pass filter extending from d.c. transmissivity or 0 Hz to a first upper limiting frequency, and the passband of the high-band bandpass filter extending from a second lower limiting frequency to a second upper limiting frequency, the first upper limiting frequency preferably being lower than the second lower limiting frequency.

4. The filter arrangement as claimed in claim 3, wherein the high-band bandpass filter is formed from at least one circuit arrangement comprising a digital filter.

5. The filter arrangement as claimed in claim 3, wherein the high-band bandpass filter is formed from at least one circuit arrangement comprising a digital signal processor.

6. The filter arrangement as claimed in claim 5, wherein the first upper limiting frequency lies in the range between 30 Hz and 70 Hz, and is preferably 50 Hz, and the second lower limiting frequency lies in the range between 250 Hz and 350 Hz, and is preferably 300 Hz.

7. The filter arrangement as claimed in claim 6, wherein the second upper limiting frequency lies in the range between 3300 Hz and 3500 Ha, and is preferably 3400 Hz.

8. The filter arrangement as claimed in claim 6, wherein the second upper limiting frequency lies in the range between 11 kHz and 13 kHz, and is preferably 12 kHz, or lies in the range between 15 kHz and 17 kHz, and is preferably 16 kHz.

9. The filter arrangement as claimed in claim 6, wherein the second upper limiting frequency lies in the range between 70 kHz and 90 kHz, and is preferably 80 kHz.

10. The filter arrangement as claimed in claim 1, wherein a single filter arrangement is utilized for transmitting analog or digital baseband signals and digital broadband signals on each one of a plurality of subscriber lines, each said subscriber line having the single filter arrangement located in a central office of a telecommunications system, for example in a switching office, wherein the high-band bandpass filters, which are associated with the subscriber lines are each embodied as circuit arrangements comprising at least one digital signal processor, and wherein the digital signal processors of these circuit arrangements are combined in a single digital signal processor unit.

* * * * *